United States Patent
Dünser

(10) Patent No.: US 9,042,578 B2
(45) Date of Patent: May 26, 2015

(54) MICROPHONE AMPLIFIER WITH OVERLOAD CIRCUIT

(75) Inventor: Wolfgang Dünser, Rapperswil-Jona (CH)

(73) Assignee: ams AG, Unterpremstaetten (AT)

( * ) Notice: Subject to any disclaimer, the term of this patent is extended or adjusted under 35 U.S.C. 154(b) by 337 days.

(21) Appl. No.: 13/607,599

(22) Filed: Sep. 7, 2012

(65) Prior Publication Data

US 2013/0064397 A1    Mar. 14, 2013

(30) Foreign Application Priority Data

Sep. 14, 2011 (DE) .......................... 10 2011 113 431

(51) Int. Cl.
| | |
|---|---|
| *H03F 99/00* | (2009.01) |
| *H03F 3/187* | (2006.01) |
| *H03F 1/52* | (2006.01) |
| *H03F 3/45* | (2006.01) |
| *H04R 19/00* | (2006.01) |
| *H04R 19/04* | (2006.01) |

(52) U.S. Cl.
CPC ................. *H03F 3/187* (2013.01); *H03F 1/52* (2013.01); *H03F 3/45475* (2013.01); *H03F 2200/426* (2013.01); *H03F 2203/45138* (2013.01); *H04R 19/005* (2013.01); *H04R 19/04* (2013.01)

(58) Field of Classification Search
CPC .............................. H03F 1/52; H03F 2200/426
USPC .......................................................... 381/120
See application file for complete search history.

(56) References Cited

U.S. PATENT DOCUMENTS

| | | | | |
|---|---|---|---|---|
| 4,780,788 | A * | 10/1988 | Kammerer et al. | 361/98 |
| 5,153,802 | A * | 10/1992 | Mertz et al. | 361/18 |
| 2004/0158765 | A1 * | 8/2004 | Charzinski | 714/4 |
| 2006/0034472 | A1 * | 2/2006 | Bazarjani et al. | 381/111 |
| 2008/0036540 | A1 | 2/2008 | Frohlich et al. | |
| 2009/0121778 | A1 | 5/2009 | Ceballos et al. | |
| 2012/0155675 | A1 | 6/2012 | Froehlich et al. | |

FOREIGN PATENT DOCUMENTS

| | | |
|---|---|---|
| DE | 102008057283 A1 | 6/2009 |
| DE | 102010054895 A1 | 12/2010 |
| DE | 102010054897 A1 | 12/2010 |
| WO | 2007132422 A1 | 11/2007 |
| WO | 2012080059 A1 | 6/2012 |

* cited by examiner

*Primary Examiner* — Ahmad F Matar
*Assistant Examiner* — Katherine Faley
(74) *Attorney, Agent, or Firm* — McDermott Will & Emery LLP

(57) ABSTRACT

A microphone amplifier comprises a microphone terminal for connecting a microphone, particularly a MEMS microphone, and an amplifier circuit with an amplifier input that is connected to the microphone terminal, and with an amplifier output that is connected to an output of the microphone amplifier. The amplifier circuit is designed to amplify an input signal present at the amplifier input in order to generate an output signal at the amplifier output. The microphone amplifier further comprises an overload circuit that is designed to detect an overload state within the amplifier circuit and to connect the amplifier input via a switching element, in particular with a low impedance, to a reference potential terminal if the overload state is detected for more than a predetermined time span.

21 Claims, 4 Drawing Sheets

Figure 3:
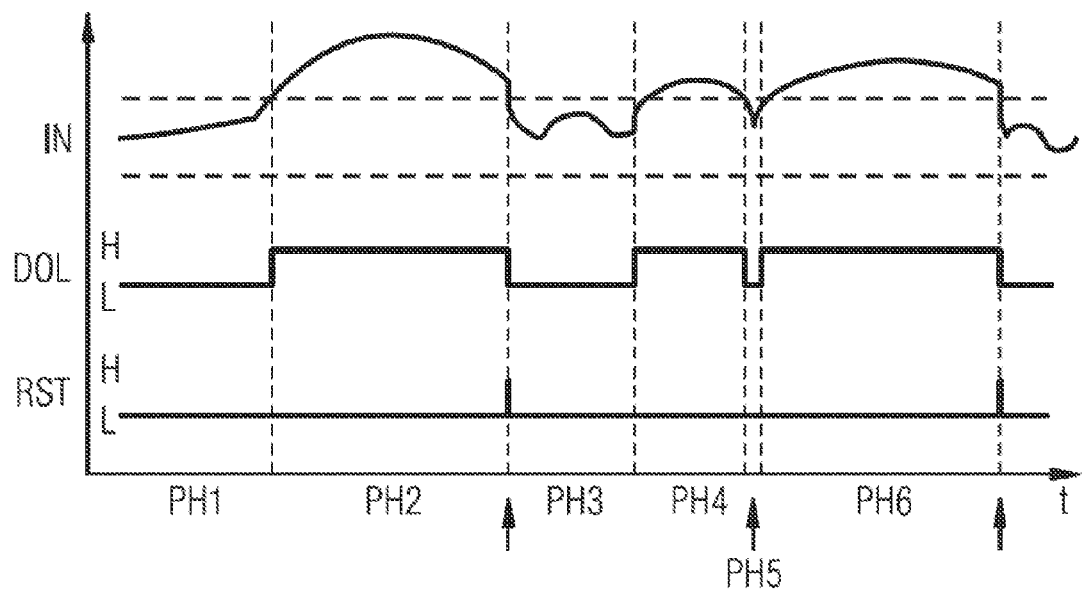

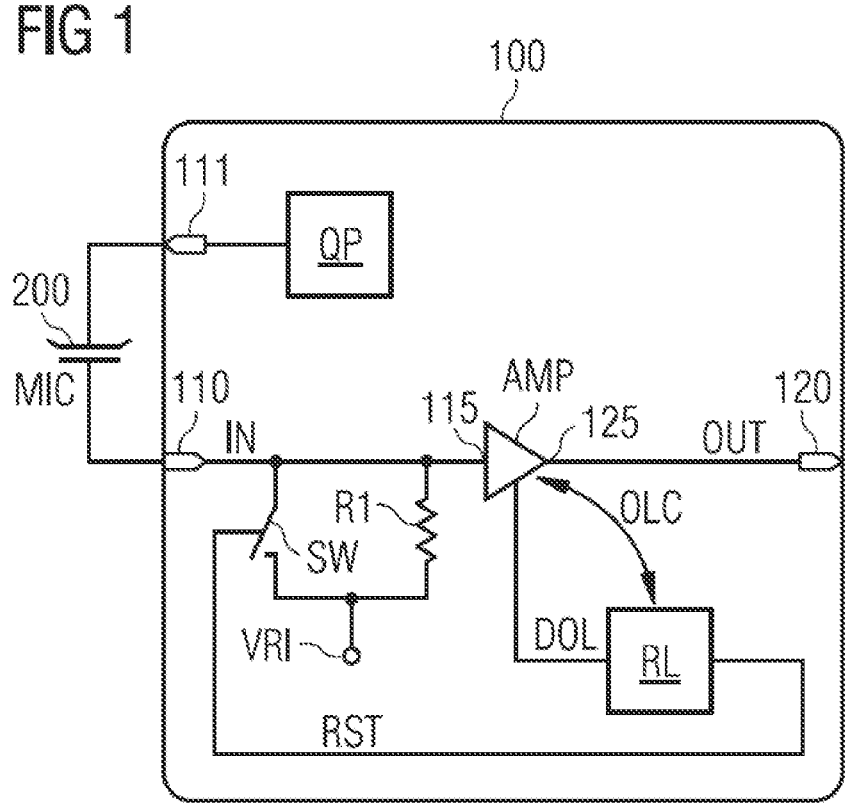
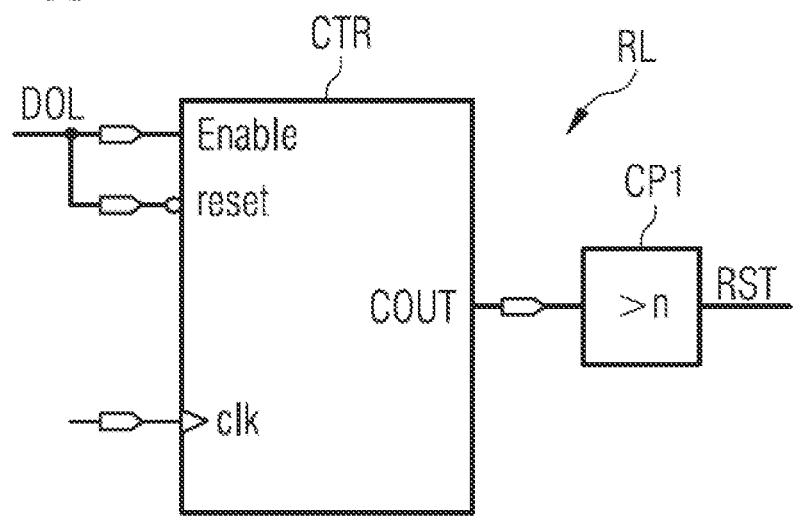

MICROPHONE AMPLIFIER WITH OVERLOAD CIRCUIT

The invention relates to a microphone amplifier that can be used, in particular, for amplification of a MEMS microphone. The invention further pertains to a digital microphone driver circuit with such a microphone amplifier as well as a method for operating a microphone amplifier.

Microphone amplifiers are frequently designed for operation with a high dynamic range of up to 100 dB. Under certain conditions, an input signal supplied by a connected microphone can exceed the dynamic range that the amplifier can process, so that an overload state in the microphone amplifier results. The input impedance of such microphones is typically very high, on the order of several gigaohms or teraohms, for example. This is achieved by providing an input bias that likewise has a high impedance.

Such microphone amplifiers are used, for example, for amplifying microphone signals from a MEMS (micro-electromechanical system) microphone. Such MEMS microphones behave like a capacitor at the input of the microphone amplifier, which in combination with the high input resistance, leads to a large time constant for a settling process, on the order of double-digit seconds, for example. Due to the large time constant, it also takes a relatively long time for the microphone amplifier to return to a normal operating state following an overload state, the microphone essentially being muted during the interim period. An overload state can be caused, for example, by a powering-on process of the microphone amplifier, by loud audio signals that are picked up by the microphone or also by mechanical stress on the MEMS microphone. In conventional microphone amplifiers for MEMS microphones, a defined voltage is applied to the input of the microphone amplifier during a powering-on process in place of the microphone signal in order to avoid an overload state.

A problem to be solved is to specify an efficient concept for a microphone amplifier, in which an overload state can be rectified even during operation of the microphone amplifier.

This problem is solved by the subject matter of the independent claims. Refinements and configurations are the subject matter of the dependent claims.

A microphone amplifier comprises, for example, a microphone terminal for connecting a microphone, in particular a MEMS microphone, as welt as an amplifier circuit with an amplifier input connected to the microphone, and an amplifier output that is coupled to one output of the microphone amplifier. The amplifier circuit is designed to amplify an input signal present at the amplifier input in order to generate an output signal at the amplifier output. In such a microphone amplifier it is possible, for example, to check or detect whether an overload state, i.e. operation of the amplifier circuit outside a predetermined and specified operating range, is present in the amplifier circuit. The overload state can be eliminated, for example, by connecting the amplifier input to a reference voltage terminal for supplying a reference voltage. Because such a connection is typically low-impedance, a small time constant with a capacitance of a MEMS microphone results, so that within a brief time, a defined voltage level can be created at the amplifier input or at the MEMS microphone. The amplifier circuit then again operates in a specified operating range.

Because the cause of the overload state is generally not known and can be based, for example, on a transient loud audio signal which is to be further picked up, it can be desirable not to create the above-mentioned connection of the amplifier input to the reference voltage terminal immediately when the overload state begins. Instead, it can be checked whether the overload state will be present over a longer predetermined period of time, so that the connection to the reference voltage terminal is only created then. Thus, overload states that appear during a starting process or due to mechanical stress can also be rectified.

In one embodiment of the microphone amplifier, it has an overload circuit, for example, that is designed to detect an overload state in the amplifier circuit and to connect the amplifier input via a switching element, in particular a low impedance one, to the reference potential terminal if the overload state is detected for longer than a predetermined period of time.

In different embodiments of the microphone amplifier, the overload circuit is designed to detect the overload state based on a detection signal at a node in the amplifier circuit that is different from the amplifier input and the amplifier output. Thus, for example, a signal within the amplifier circuit that differs from the input signal and the output signal is evaluated. A control signal of a transistor in the amplifier circuit or a signal in a current path that is used during the amplification of the input signal can be used as a detection signal, for instance.

In different embodiments, the overload circuit is also designed to disconnect the amplifier input from the reference voltage terminal if the overload state is not detected. Accordingly, the connection between the amplifier input and the reference voltage terminal is maintained only until the overload state is rectified and the amplifier circuit is accordingly being operated in a specified operating range.

For example, the amplifier input is coupled to the reference voltage terminal via a resistor element, in particular with a high impedance. Accordingly, a resistor with a high resistance value, in the range of several gigaohms or teraohms, is provided between the amplifier input and the reference voltage terminal. Alternatively to a resistor, back-to-back connected diodes can be used, the high resistance value being achieved by operating the diodes in the tower passband range, markedly below the forward voltage. For example, a mean voltage value at the operating point at the amplifier input is substantially as high as the value at the reference potential terminal.

In different embodiments of the microphone amplifier, the overload circuit comprises a counter circuit that is designed to increment a counter under clock control as soon as and for as long as the overload state is detected. This overload circuit is designed to connect the amplifier input to the reference potential terminal whenever the counter has been incremented by more than a predetermined numerical value. For example, the counter in the counter circuit begins to run when the overload state in the amplifier circuit is detected. The counter is incremented as long as the overload state persists. If the counter has counted up by more than the predetermined counter value from the initial count value, the overload circuit generates a control signal or reset signal for the switching element, which then connects the amplifier input to the reference potential terminal.

When the overload state no longer exists, even without the connection of the amplifier input to the reference voltage terminal having been established by the switching element, the counter is preferably reset to the initial value. Accordingly the counter circuit is designed to reset the counter to the initial value if no overload state is detected.

It is equally possible for the counter in the counter circuit to be decremented under clock control when the overload state exists, the switching element being triggered in this case if the counter has been reduced by more than a predetermined count value.

In different embodiments of the microphone amplifier, the overload circuit comprises a counter circuit that is designed to charge a capacitor as soon as and for as long as the overload state is detected. The overload circuit in this case is designed to connect the amplifier input to the reference voltage terminal if a charge voltage of the capacitor has reached or exceeded a predetermined value. The counter circuit may be designed to discharge the capacitor, by low-impedance bypassing for example, when no overload state is detected.

The overload circuit may be designed to detect the overload state based on a comparison of the detection signal to a first threshold value. For example, an overload state is detected whenever the first threshold is exceeded or not reached, depending on the position of the selected node point. It is additionally possible for the overload circuit to be designed to detect that the overload state has ended based on a comparison of the detection signal to a second threshold value. Thus there can be two different threshold values for detecting that an overload state exists and for detecting that an overload state no longer exists. An overload state can therefore be detected with a hysteresis. For example, the detection signal is evaluated with a Schmitt trigger for this purpose. Alternatively, two separate comparators can also be used.

In different embodiments, the node is a terminal of a controlled path of an input transistor controlled based on the input signal. Alternatively, the node is connected to this terminal of the control path via a resistor element.

In other configurations, the node is a control terminal of a controlled current source, via which a current for the output signal is made available. The influence of an overshoot of the input voltage at the amplifier input on the voltage at the control terminal of the controlled current source is typically greater than that on the actual output signal. Thus an overload state can be detected with high precision in this configuration.

In different embodiments, the microphone amplifier has an interface with three contacts, the first contact formed by the output of the microphone amplifier and the second and third contacts being formed by a first and a second reference potential terminal. A supply voltage and a ground potential may be present at the first and second reference potential terminals, for example. Such an interface can be referred to as a three-wire interface.

In other configurations, the microphone amplifier has an interface with two contacts, the first contact again being formed by the output of the microphone amplifier, and the second contact by a reference potential terminal, preferably a ground terminal. Such an interface can be referred to as a two-wire interface.

Both for microphone amplifiers with a two-wire interface and also those with a three-wire interface, two additional contacts can be present on the microphone amplifier, to which a microphone, especially a MEMS microphone, can be connected.

Especially for microphone amplifiers with a two-wire interface, it can be desirable to check the load state of the amplifier circuit even more precisely. In such an amplifier it can be necessary, in case of excessive load, to reset the amplifier circuit or the microphone amplifier by connecting the amplifier input to the reference voltage terminal directly, in order to avoid an excessive load and an associated deterioration of a voltage supply for connected additional components. Lower overloads, which merely cause the microphone amplifier to be operated outside a specified range, can be handled according to the previously described time-dependent principle.

Accordingly, the overload circuit is designed in different embodiments to detect a first overload state with a first load of an amplifier circuit and to connect the amplifier input to the reference voltage terminal if the first overload state is detected for longer than the predetermined time span, and to detect a second overload state with a second load, higher than the first load, and to connect the amplifier input to the reference voltage terminal as soon as the second overload state is detected. Accordingly, an immediate resetting of the amplifier circuit is combined with a time-dependent resetting of the amplifier circuit.

In different embodiments, the overload state can also be detected simultaneously at several points in the amplifier circuit. For example, an overload state can be considered detected if the conditions for an overload state are present at one of the positions.

A microphone amplifier according to one of the above-described embodiments can also be used in a digital microphone driver circuit. Such a digital microphone driver circuit comprises, for example, a microphone amplifier according to one of the above described embodiments and a digital output that is coupled to the output of the microphone amplifier via an analog-digital converter. The microphone, especially MEMS microphone, is again connected to the input of the microphone amplifier.

In different embodiments, the comprised overload circuit is designed to determine the overload state based on the analog-digital converted output signal and to connect the amplifier input to the reference voltage terminal if the analog-digital converted output signal has a possible maximum value or a possible minimum value for longer than the predetermined time span.

A method will be described below for operating a microphone amplifier that comprises a microphone terminal for connecting a microphone, particularly a MEMS microphone, and an amplifier circuit with an amplifier input that is connected to the microphone terminal, and with an amplifier output that is connected to an output of the microphone amplifier. In the method, an input signal present at the amplifier input is amplified in order to generate an output signal at the amplifier output. It is detected whether the amplifier circuit is in an overload state, for example based on a detection signal at a node within the amplifier circuit that is different from the amplifier input and the amplifier output. If the overload state is detected for longer than a predetermined time span, the amplifier input is connected to a reference voltage terminal, in particular low-ohmically.

Other configurations of the method follow directly from the various embodiments of the microphone amplifier that were previously described.

The invention will be described in detail below for several embodiment examples with reference to the figures. Identical reference numbers label elements or components with identical functions. Insofar as circuit parts or components correspond to one another in function, a description of them will not be repeated in each of the following figures.

Figure 4:
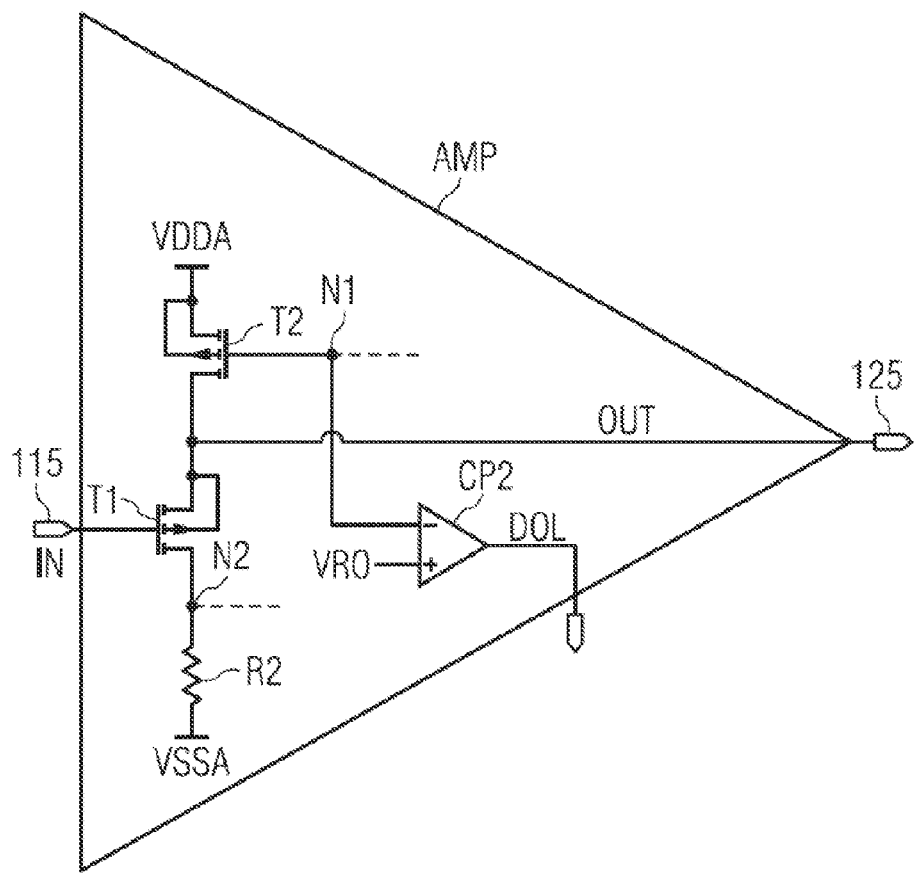
Figure 5:
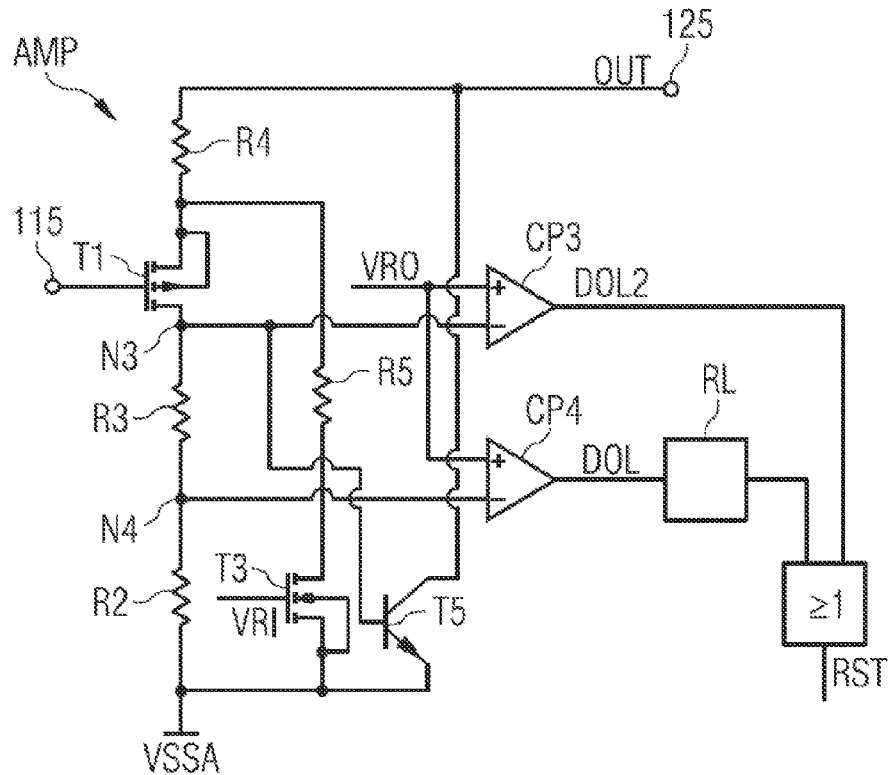
Figure 6:
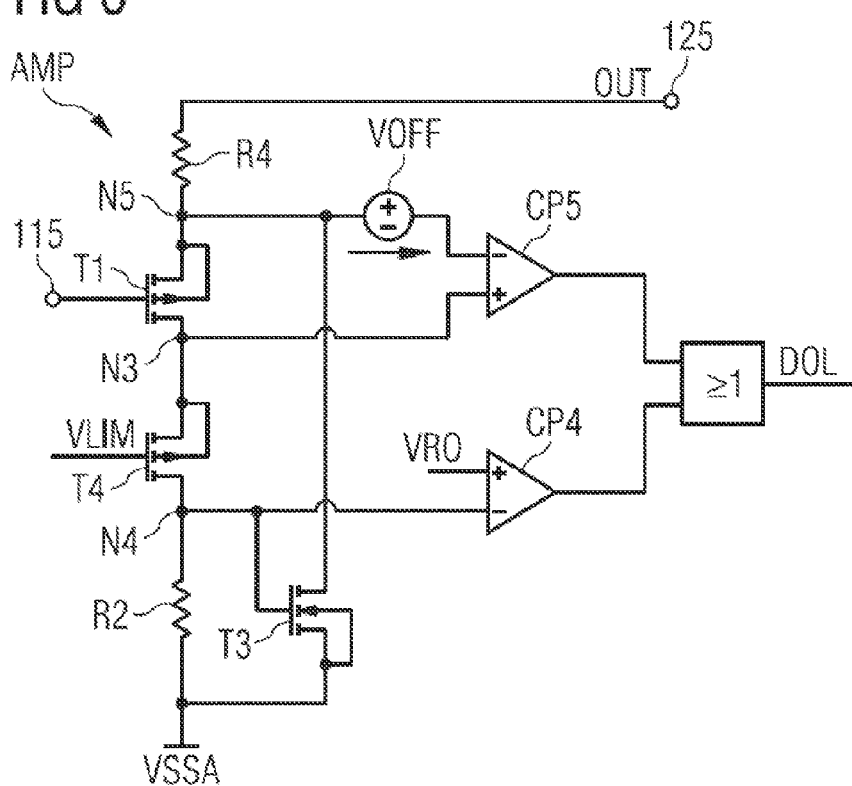
Figure 7:
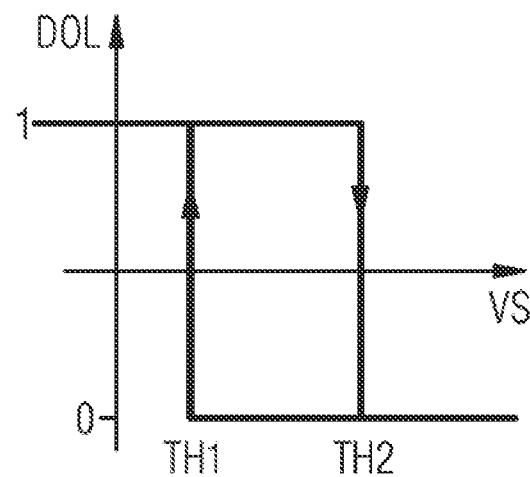
Figure 8:
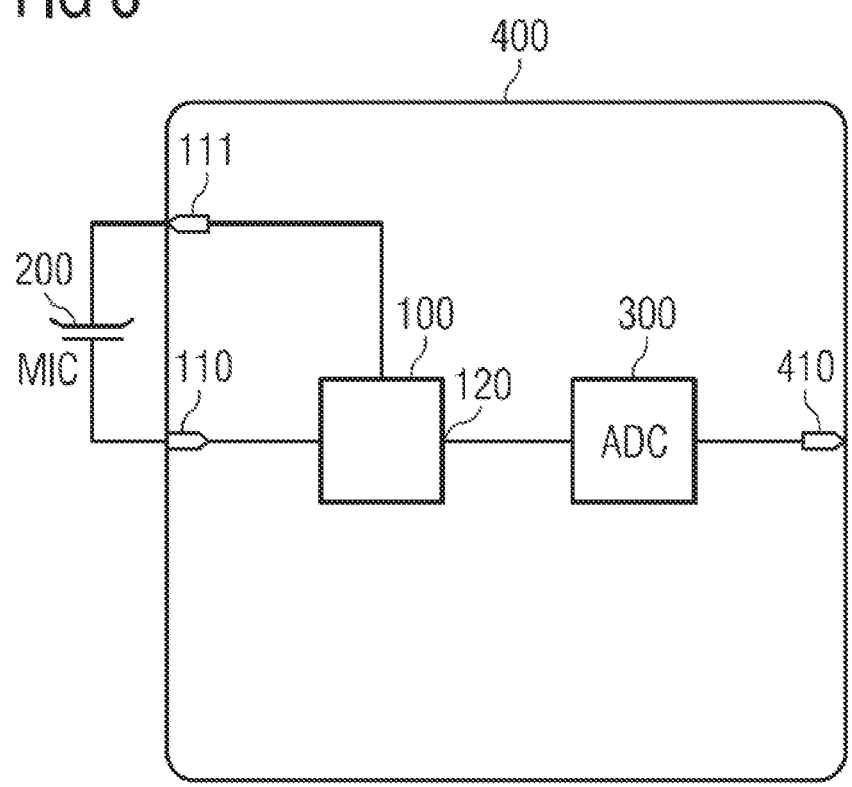

Therein:

FIG. 1 shows an embodiment of a microphone amplifier,
FIG. 2 shows an embodiment of a reset logic circuit,
FIG. 3 shows a signal timing chart for signals in a microphone amplifier,
FIG. 4 shows an embodiment of an amplifier circuit,
FIG. 5 shows another embodiment of an amplifier circuit,
FIG. 6 shows another embodiment of an amplifier circuit, FIG. 7 shows a hysteresis diagram, and FIG. 8 shows an embodiment of a digital microphone driver circuit.

FIG. 1 shows an embodiment of a microphone amplifier 100 with a microphone terminal 110 and a microphone bias terminal 111, which is connected to a bias charge pump QP. A microphone MIC 200, configured as a MEMS microphone for example, is connected to the terminals 110, 111. The MEMS microphone 200 comprises a sound pressure-dependent capacitor, for example.

The microphone amplifier 100 comprises an amplifier circuit AMP with an amplifier input 115, connected to the microphone input 110 for supplying an input signal IN, and an amplifier output 125 that is connected to an output 120 of the microphone amplifier 100 in order to issue an output signal OUT. The amplifier input 115 is connected via a resistor element R1 to a reference voltage terminal VRI, the resistor element R1 having, in particular, a high resistance value or being operated at a high resistance value. A switching element SW that couples the amplifier input 115 to the reference potential terminal VRI and can be driven based on a reset signal RST is also provided. An overload circuit OLC that is arranged partially in the amplifier circuit AMP and partially in a reset circuit RL is provided in the microphone amplifier 100. In particular, an overload detection signal DOL, which is supplied to the reset logic circuit RL, is provided inside the amplifier circuit AMP. The reset signal RST is present at one output of the reset logic circuit RL.

During operation of the microphone amplifier 100, a bias voltage present at microphone 200 is generated at the terminal 111 by the charge pump QP. The amplifier input 115 or the input 110 of the microphone amplifier 100 is also connected via the resistor element R1 to the bias voltage at the reference potential terminal VRI. The amplifier input 115, however, is connected to the reference potential terminal VRI at such a high impedance that the input signal IN from the microphone 200 can drive the amplifier input 115. For this purpose, a very high ohmic resistance, in the range of more than 1 teraohm, is selected for the resistor element R1. It is also possible, however, to use two back-to-back diodes for the resistor element R1. Since the voltage difference between the input voltage and the voltage at the reference voltage terminal VRI is small, in particular below the forward voltage of the diodes, one of the diodes is operated in the blocking range and the other in the resistance range, no to speak, with a low, negligible current, which results in the high resistance value.

The input signal IN is amplified by the amplifier circuit AMP into the output signal OUT at the amplifier output 125 or at the output 120 of the microphone amplifier 100. The gain factor of the amplifier circuit AMP can also be in the range of 1, so that in essence an impedance conversion of the microphone signal or input signal IN is present. The dynamic range in which it makes sense for the amplifier circuit AMP to amplify the input signal IN is limited. Specified operation for the amplifier circuit lies inside this dynamic range. If the input signal IN has levels outside this dynamic range, however, a meaningful or sufficient amplification of the input signal IN is not typically possible, or is limited by the supply voltage. In this case, in the absence of a specified operation, there is an overload state in the amplifier circuit AMP.

Such an overload state can occur, for example, in a power-on phase of the microphone amplifier. This is caused by the fact that an increasing voltage at the charge pump QP raises the voltage at the microphone terminal 110 and forces the amplifier input 115 into an overload situation. An overload state in the amplifier circuit AMP can also occur if the MEMS microphone 200 is subjected to an elevated mechanical stress.

In ordinary operation of the microphone amplifier 100, an overload state can also appear if very loud audio signals are picked up by the MEMS microphone 200.

The voltage that leads to the overload situation is stored in the capacitor of the MEMS microphone 200. Theoretically, this voltage decays after a certain time via the resistor element R1, until the input signal IN is again in the specified dynamic range. Due to the very high resistance value of the resistor element R1 and the capacitance of the MEMS microphone 200, which lies in the range of several picofarads for example, a very large time constant arises, which may be on the order of tens of seconds. In order to eliminate the overload situation more quickly, the amplifier input 115 can be connected directly via the switching element SW at a low impedance to the reference potential terminal VRI, so that a markedly smaller time constant for the discharging of the capacitor in the MEMS microphone 200 results. In this way, the overload state can be eliminated almost immediately with a closed switching element SW.

The overload circuit OLC, which is designed to detect the overload state in the amplifier circuit AMP and to emit a corresponding detection signal DOL to the reset logic circuit RL comprising the overload circuit OLC, is provided in order to determine the overload state. In particular, the reset logic circuit is designed to emit the reset signal RST to close the switching element SW only if the overload state is detected for longer than a predetermined time span, i.e. the overload detection signal DOL is present for longer than the predetermined time span. Due to the resetting of the amplifier circuit AMP, no amplified microphone signal is present at the amplifier output 125 for a brief time. This is desirable, for example, during a power-on phase or in case of the appearance of an unexpected mechanical stress on the microphone 200. However, if the overload state results from a transient loud audio signal, particularly one in a desired frequency range, it is possible to do without a resetting of the amplifier circuit AMP because such an overload state generally disappears on its own without resetting.

The predetermined time span can therefore be dimensioned in such a manner that, for example, signals having a frequency below a tower limit frequency of the amplifier AMP do not provoke a resetting of the amplifier circuit AMP even at a critical level that briefly leads to an overload state.

FIG. 2 shows one possible embodiment of a reset logic circuit RL. In this embodiment, the reset logic circuit RL comprises a counter circuit CTR with an input ENABLE for initiating a counting process, an inverted input RESET for resetting a counter state to an initial value and a clock input CLK for supplying a clock signal. A current counter value is emitted at an output COUT of the counter circuit CTR to a counting comparator CP1. The counting comparator CP1 is designed to emit the reset signal RST for closing the switching element SW if the current counter state is greater than a limit value n. Accordingly, the count value in the counter circuit CTR is reset to or held at an initial value, 0 for example, so long as the overload detection signal DOL has a low level and thereby is available at a high level from the inverted input RESET. As soon as the overload state occurs and the overload detection signal DOL has a high level, the counter state in the counter circuit CTR begins to increment based on the clock signal at the input CLK. Therefore if the overload detection signal COL is present for longer than n cycles of the clock signal at the ENABLE input, the condition in the counter comparator CP1 is fulfilled, so that resetting of the amplifier circuit AMP is triggered by a corresponding reset signal RST. If the overload state is temporarily no longer present, the counter state is reset and a new counting process is started upon the appearance of the next overload state.

FIG. 3 shows an example signal-timing chart of signals inside the microphone amplifier 100, on the basis of which the time-dependent resetting of the amplifier circuit 115 is to be explained. The signal-timing chart illustrates a signal curve of the input signal IN, a resulting curve of the overload detection signal DOL and a curve of the reset signal RST. In the respective phases PH1, PH3 and PH5, the input signal IN is below the overload threshold, resulting in a low level of the overload detection signal DOL. In the other phases, PH2, PH4 and PH6, the input signal IN is above the overload threshold, so that an overload state is present and the overload detection signal DOL assumes a high level.

After the overload detection signal DOL in phase PH2 has been present longer than the predetermined time span, the reset logic circuit RL sets the reset signal RST temporarily to a high level, in order to reset the amplifier circuit AMP, which almost immediately leads to the return of the input signal IN to below the overload threshold. On the other hand, the overload detection signal DOL in phase PH4 is present only for a time span that is shorter than the predetermined time span, so that no resetting of the amplifier circuit AMP is initiated. In phase PH6, the (predetermined time span is again reached and a corresponding reset signal RST with a high level is generated.

The predetermined time span follows, as previously mentioned, from the lower limit frequency to be processed by the amplifier circuit AMP, for example. In the audio field, this limit frequency is set to 20 Hz for example, which corresponds to a period of 50 ms or to the duration of a half-wave of 25 ms. Since exceeding the overload threshold in the vicinity of the zero crossings can be neglected for sinusoidal oscillations due to the clearly higher maximum amplitude, it is possible to choose the limit condition that half the maximum amplitude is higher than the overload threshold, for example. This is the case for a sinusoidal form during roughly ⅔ of the duration of a half-wave, so that roughly 16 ms results as the predetermined time span. When using the reset logic circuit RL as described in FIG. 2, this value can be converted via a clock frequency of the clock signal into a corresponding counter value or limit value n. The time span of 16 ms mentioned by way of example should by no means be considered to be restrictive, but is only intended to explain how a predetermined time span can be determined from a predetermined limit frequency, for example.

The presence of an overload state can be detected in various manners. It is also possible for the microphone amplifier to be equipped with a two-wire interface or with a three-wire interface. The number of contacts in the interface also determines the structure and behavior of the amplifier circuit, for example. The existence of an overload state is preferably determined based on a detection signal at anode in the amplifier circuit AMP that is different from the amplifier input 115 and the amplifier output 125.

FIG. 4 shows an embodiment example of an amplifier circuit AMP that can be used in particular for a microphone amplifier with a three-wire interface. The first contact is the amplifier output 125 or the output of the microphone amplifier 120. A second and third contact of the interface are formed by reference potential terminals VDDA, VSSA. A supply voltage is provided at the terminal VDDA for example, while aground potential is present at the terminal VSSA. In the amplifier circuit AMP, a series connection of two p-channel field effect transistors T1, T2 and a resistor R2 is provided between the reference potential terminals VDDA, VSSA. A gate terminal of the transistor T1, which is provided as an input transistor, is connected to the amplifier input 115 to supply an input signal IN. A node between the transistors T1, T2 forms the amplifier output 125 for emitting the amplified output signal OUT. The gate terminal of the transistor T2 is connected to a node N1 that is coupled to an inverting input of a comparator CP2. An overload reference voltage VRO is present at the noninverting input of the comparator CP2. The overload detection signal DOL is emitted at the output of the comparator CP2. The comparator CP2 is correspondingly a component of the overload circuit OLC, as shown in FIG. 1.

In the operation of the amplifier circuit AMP, the transistor T2 functions as a controlled current source, which provides a current for the transistor T1 or the output signal OUT. The current source is controlled in a familiar manner based on the input signal IN, for example. The voltage at the node N1 in a normal operating state is always more than 100 mV higher than the voltage of the reference potential terminal VSSA. In the overload case, the transistor T2 is fully saturated, whereby the voltage at the node N1 drops, for example, to a value of roughly 50 V or less above the voltage at the reference potential terminal VSSA. With an appropriate selection of the overload reference voltage VRO, therefore, the overload detection signal DOL is set to a high level when the voltage at the node N1 falls below the selected overload reference voltage VRO.

It is more efficient, for example, to monitor the voltage at the node N1 than to directly monitor the voltage of the output signal OUT. Due to the amplification of the transistor T2, the gate voltage at the node N1 changes more markedly between a normal operation and the overload state than does the voltage of the output signal OUT. Thereby a more precise detection of the overload state becomes possible.

The comparator CP2 can also be implemented differently in order to detect the falling of the voltage at the node N1. For example, the comparator CP2 has an internal offset that is achieved by a consciously selected asymmetrical structure of the comparator CP2. In this case it is possible to forgo providing a separate overload reference voltage VRO.

In other configurations, the voltage can be monitored at the node N2 between the transistor T1 and the resistor R2 in order to detect an overload state.

FIG. 5 shows a configuration of the amplifier circuit AMP that is especially suitable for a microphone amplifier 100 with a two-wire interface. In this case, the amplifier circuit AMP is supplied via a potential at the amplifier output 125 or at the output 120 of the microphone amplifier 100. The amplifier circuit AMP in the illustrated embodiment is based on a super source follower circuit. The amplifier input 115 for supplying the input signal IN is connected to the gate terminal of the transistor T1. The drain terminal of the transistor T1 is connected via a series circuit of resistors R2, R3 to the reference potential terminal VSSA, a node N3 resulting between the transistor T1 and the resistor R3, and a node N4 resulting between the resistors R3, R2. A base terminal of a transistor T5 is also connected to the node N3. The source terminal of the transistor T1 is connected via an additional resistor R4 to the amplifier output 125. A feedback via the resistors R2, R3 and the transistor T5 is provided in order to generate a constant current on the source-drain path of the transistor T1. The transistor T5, which is formed as a bipolar transistor for example, is connected via its collector to the amplifier output 125. A transistor T3, which is constructed as an n-channel field effect transistor, is connected via a resistor R5 in parallel to the transistor T1 and the resistors R2, R3. The gate terminal of the transistor T3 is connected to the reference voltage terminal VRI, the resistance ratio of the resistors R4 and R5 determining the gain.

The circuit shown in FIG. 5, based on a super source follower circuit, allows a gain of approximately 1 to 10, which is nearly independent of the load at the amplifier output 125 due to the current path of transistor T5 connected in parallel to the current path of the transistor T1.

In this embodiment, the amplifier circuit AMP also has two comparators CP3, CP4, whose noninverting inputs are connected to the overload reference voltage VRO. The inverting input of the comparator CP3 is connected to the node N3, while the inverting input of the comparator CP4 is connected to the node N4. An output of the comparator CP3, at which another overload detection signal DOL2 is present, is connected to an input of an OR element. An output of the second comparator CP4, at which the overload signal DOL is present, is connected via the reset circuit RL, to another input of the OR element. The reset signal RST is present at the output of the OR element.

Especially for the case of an amplifier circuit with a two-wire interface, two different overload states can be distinguished. In the one overload case, specified operation of the amplifier circuit AMP is not possible, as in the case of the previously described embodiments, especially for the three-wire interface. In this case, a first overload of the amplifier circuit is reached or exceeded. In an another overload state of the amplifier circuit, a second load is reached or exceeded, which is higher than the first load, for example. In this overload state, the amplifier circuit AMP is so heavily loaded, by the load on the supply voltage in particular, that other circuitry elements connected to the amplifier circuit may be affected. Accordingly, not only is no regular amplification operation still possible, the operation of the circuit itself may be endangered. Therefore it makes sense to immediately initiate resetting of the amplifier circuit AMP in this additional overload state, whereas a time-dependent resetting is sufficient for the first overload state with the lower first load.

If the voltage of the input signal IN at the gate of transistor T1 falls too much, due to a negative half-wave, for example, the voltage at nodes N3, N4 decreases. Because of the voltage divider formed by the resistors R2, R3, the voltage at node N4 is lower than at node N3.

The existence of the first overload state is accordingly checked by the evaluation of the voltage at node N4 with the comparator CP4, whereas the existence of the second overload state is checked with the comparator CP3 by evaluating the voltage at node N3. In particular, the first overload state is reached in every case as soon as the second overload state is recognized in the comparator CP3.

As explained for the embodiment in FIG. 4, the comparison in the comparators CP3, CP4 to the overload reference voltage can also be done in a different manner, for example by a symmetrical construction of the comparators and the resulting internal offset. The underlying comparator voltage can be selected, for example, at roughly 50 mV above the potential at the reference potential terminal VSSA. Immediate resetting of the amplifier circuit AMP by the second overload detection signal DOL2 and time-dependent resetting based on the overload detection signal DOL are implemented by the illustrated OR element.

FIG. 6 shows another embodiment of an amplifier circuit AMP that, similarly to the circuit as shown in FIG. 5, is designed for a two-wire interface. In this embodiment, another transistor T4, connected between the drain terminal of the transistor T1 and the resistor R2, is provided in the current path of the transistor T1. The transistor 14 circuit serves as a current limiter that is intended to prevent the voltage at the amplifier output 125 from falling too far. The limitation is controlled by a limitation voltage VLIM that is generated inside the circuit, with a band gap circuit or the like, for example.

In the illustrated embodiment, the comparator CP4 is again provided, its inverting input being connected to the node N4 above the resistor R2. Another comparator CP5 is provided, whose noninverting input is connected to the node N3 at the drain terminal of the transistor T1, whereas the inverting input is coupled via an offset voltage source VOFF to a node N5 at the source terminal of the transistor T1. The outputs of the comparators CP4, CP5 are fed to an OR element that supplies an overload detection signal DOL at its output that is further processed by the reset logic circuit, for example.

In this embodiment, an overload state is detected at various points of the amplifier circuit AMP, existence at one point being sufficient to determine the overload state. This is realized by the OR element. As an additional or alternative criterion for the existence of the overload state, the source drain voltage of the transistor T1 is monitored between the nodes N5 and N3, for example. If this source-drain voltage falls below the offset voltage VOFF, the existence of an overload state can be inferred. The offset voltage of the offset voltage source VOFF is again below roughly 50 mV, for example.

The existence of an overload state that could impair the operation of additional circuitry components can be ignored in this example, because an excessive load on the supply at the amplifier input 125 and an excessive voltage drop associated therewith can be prevented by the transistor T4.

In the previously presented embodiments, the respective detection signal is compared to a fixed voltage threshold. If the corresponding detection signal is slightly below this threshold, there is accordingly no continuous active overload detection signal. Consequently, no resetting is initiated by the reset logic circuit RE, for example, because a counter is reset each time the threshold is no longer reached. Accordingly, it can be desirable to perform the evaluation of the corresponding detection signal with a hysteresis function.

For example, the overload state is detected based on a comparison of the detection signal to a first threshold value, whereas the end of the overload state is determined based on a comparison of the detection signal to a second threshold value. In the previously described embodiments, for example, the overload state would be detected if the voltage level at the relevant node falls below the predetermined first threshold value and will only be determined not to exist if a second higher threshold value is again exceeded.

This is illustrated for the sake of example in the signal diagram of FIG. 7. Accordingly, the overload detection signal DOL is set to a high level if a detection signal VS falls below the first threshold value TH1, and is set to the low level if the detection signal VS exceeds the second threshold value TH2.

This functionality can be achieved, for example, by using Schmitt triggers or circuits with Schmitt triggers, which implement such a hysteresis function, for the respective comparators CP2, CP3, CP4, CP5.

An overload state is detected in the previously presented embodiments merely based on an evaluation of a deflection of the input signal IN, particularly an excessively large deflection in the negative direction for microphone amplifiers with two-wire interfaces, and in the positive direction for microphone amplifiers with three-wire interfaces. In alternative embodiments, an excessive deflection in the respectively different direction can also be detected. It is further possible to evaluate both excessively negative deflections and excessively positive deflections of the input signal and to use this with corresponding logic such as an OR element for the resetting of the amplifier circuit AMP. The corresponding limits for the positive exceedance and the negative exceedance can also be selected differently, based, for example, on the respective load capacity of the amplifier circuit.

FIG. 8 shows an embodiment of a digital microphone driver circuit 400 that comprises a microphone amplifier 100 according to one of the above-described embodiments. The microphone driver circuit 400 has terminals 110, 111 that can be connected to the microphone, and in particular a MEMS microphone 200. An analog-to-digital converter 300 that converts the output signal OUT, which exists in analog form, into a digital signal in order to emit it at a digital output 410 is provided at the output 120 of the microphone amplifier 100.

What is claimed is:

1. A microphone amplifier, comprising:
    a microphone terminal for connecting a microphone, in particular a MEMS microphone;
    an amplifier circuit with an amplifier input, connected to the microphone terminal, and an amplifier output that is connected to an output of the microphone amplifier, wherein the amplifier circuit is designed to amplify an input signal at the amplifier input in order to generate an output signal at the amplifier output; and
    an overload circuit that is designed to detect the existence of an overload state within the amplifier circuit based on a detection signal at a node within the amplifier circuit that is different from the amplifier input and the amplifier output and to connect the amplifier input via a switching element, in particular with a low impedance, to a reference potential terminal if the overload state is detected for more than a predetermined time span.

2. A microphone amplifier according to claim 1, in which the overload circuit is designed to disconnect the amplifier input from the reference potential terminal if the overload state is not detected.

3. A microphone amplifier according to claim 1, in which the overload circuit comprises a counter circuit that is designed to increment or decrement a counter under clock control as soon as and for as long as the overload state is detected, wherein the overload circuit is designed to connect the amplifier input to the reference potential terminal if the counter is incremented or decremented by more than a predetermined counter value.

4. A microphone amplifier according to claim 3, in which the counter circuit is designed to reset if no overload state is detected.

5. A microphone amplifier according to claim 1, in which the overload circuit comprises a charging circuit that is designed to charge a capacitor as soon as and for as long as an overload state is detected, wherein the overload circuit is designed to connect the amplifier input to the reference potential terminal if a charge voltage of the capacitor reaches or exceeds a predetermined value.

6. A microphone amplifier according to claim 5, in which the charging circuit is designed to stop charging reset if no overload state is detected.

7. A microphone amplifier according to claim 1, in which the overload circuit is designed to detect the overload state based on a comparison of the detection signal to a first threshold value.

8. A microphone amplifier according to claim 1, in which the overload circuit is designed to detect that the overload state has ended based on a comparison of the detection signal to a second threshold value.

9. A microphone amplifier according to claim 1, in which the node is a terminal of a controlled path of an input transistor controlled based on the input signal, or is coupled to this terminal of the controlled path via a resistor element.

10. A microphone amplifier according to claim 1, in which the node is a control terminal of a controlled current source, via which a current for the output signal is made available.

11. A microphone amplifier according to claim 1, in which the microphone amplifier has an interface with three contacts, the first contact formed by the output of the microphone amplifier and the second and third contacts being formed by a first and a second reference potential terminal.

12. A microphone amplifier according to claim 1, in which the microphone amplifier has an interface with two contacts, the first contact formed by the output of the microphone amplifier and the second contact formed by a reference potential terminal.

13. A microphone amplifier according to claim 1, in which the overload circuit is designed:
    to detect a first overload state with a first load within the amplifier circuit and to connect the amplifier input to the reference potential terminal when the first overload state is detected for longer than the predetermined time span; and
    to detect a second overload state with a second load within the amplifier circuit that is higher than the first load, and to connect the amplifier input to the reference potential terminal as soon as the second overload is detected.

14. A microphone amplifier according to claim 1, in which the amplifier input is coupled to the reference potential terminal via a resistor element, in particular, coupled with a high impedance.

15. A digital microphone driver circuit with a microphone amplifier according to claim 1 and with a digital output that is coupled to the output of the microphone amplifier via an analog-digital converter.

16. A digital microphone driver circuit according to claim 15, in which the overload circuit is designed to determine the overload state further based on the analog-digital converted output signal and to connect the amplifier input to the reference voltage terminal if the analog-digital converted output signal has a possible maximum value or a possible minimum value for longer than the predetermined time span.

17. A method for operating a microphone amplifier that comprises a microphone terminal for connecting a microphone, particularly a MEMS microphone, and an amplifier circuit with an amplifier input that is connected to the microphone terminal, and with an amplifier output that is connected to an output of the microphone amplifier, comprising:
    amplifying an input signal present at the amplifier input in order to generate an output signal at the amplifier output;
    detecting whether the amplifier circuit is in an overload state based on a detection signal at a node within the amplifier circuit that is different from the amplifier input and the amplifier output; and
    connecting the amplifier input, in particular with a low impedance, to a reference potential terminal, if the overload state is detected for longer than a predetermined time span.

18. A method according to claim 17, further comprising:
    disconnecting the amplifier input from the reference voltage terminal (VRI) if the overload state is not detected.

19. A method according to claim 17, further comprising:
    incrementing or decrementing a counter under clock control as soon as and for as long as the overload state is detected; and
    connecting the amplifier input to the reference potential terminal if the counter is incremented or decremented by more than a predetermined counter value.

20. A method according to claim 17, further comprising:
charging a capacitor as soon as and for as long as the overload state is detected; and
connecting the amplifier input to the reference potential terminal if a charge voltage of the capacitor reaches or exceeds a predetermined value.

21. A method according to claim 17, further comprising:
detecting a first overload state with a first load within the amplifier circuit;
connecting the amplifier input to the reference potential terminal when the first overload state is detected for longer than the predetermined time span;
detecting a second overload state with a second load within the amplifier circuit that is higher than the first load; and
connecting the amplifier input to the reference potential terminal as soon as the second overload is detected.

* * * * *